US012310109B2

(12) United States Patent
Zheng (10) Patent No.: US 12,310,109 B2
(45) Date of Patent: May 20, 2025

(54) DISPLAY PANEL INCLUDING A SUBSTRATE HAVING PROTRUDING PORTIONS, METHOD FOR MANUFACTURING DISPLAY PANEL, AND DISPLAY DEVICE

(71) Applicants: Huizhou China Star Optoelectronics Display Co., Ltd., Huizhou (CN); TCL China Star Optoelectronics Technology Co., Ltd., Shenzhen (CN)

(72) Inventor: Zeke Zheng, HuiZhou (CN)

(73) Assignees: Huizhou China Star Optoelectronics Display Co., Ltd., Huizhou (CN); TCL China Star Optoelectronics Technology Co., Ltd., Shenzhen (CN)

( * ) Notice: Subject to any disclaimer, the term of this patent is extended or adjusted under 35 U.S.C. 154(b) by 0 days.

(21) Appl. No.: 17/623,317

(22) PCT Filed: Dec. 17, 2021

(86) PCT No.: PCT/CN2021/139295
§ 371 (c)(1),
(2) Date: Dec. 28, 2021

(87) PCT Pub. No.: WO2023/103055
PCT Pub. Date: Jun. 15, 2023

(65) Prior Publication Data
US 2024/0055443 A1    Feb. 15, 2024

(30) Foreign Application Priority Data
Dec. 10, 2021 (CN) .......................... 202111505677.7

(51) Int. Cl.
*H10D 86/60* (2025.01)
*H10D 86/01* (2025.01)
*H10D 86/40* (2025.01)

(52) U.S. Cl.
CPC ......... *H10D 86/60* (2025.01); *H10D 86/0241* (2025.01); *H10D 86/443* (2025.01)

(58) Field of Classification Search
None
See application file for complete search history.

(56) References Cited

U.S. PATENT DOCUMENTS 4,183,629 A    1/1980 Nishimura et al.
6,025,901 A *  2/2000 Adachi ............... G02F 1/13452
                                                349/158

(Continued)

FOREIGN PATENT DOCUMENTS

CN    107479229    12/2017
CN    108267903    7/2018

(Continued)

*Primary Examiner* — Kirk W Hermann
(74) *Attorney, Agent, or Firm* — PV IP PC; Christopher S. Ruprecht; Wei Te Chung (57) ABSTRACT

The display panel includes: a substrate, wherein a plurality of first protruding portions are disposed on a first edge of the substrate; a line layer including a plurality of first traces and a plurality of second traces, wherein the first traces are disposed on the first surface, the second traces are disposed on the second surface, and each of the first traces and each of the second traces respectively extend to one of the first protruding portions; and a conducting layer covering the first protruding portion, wherein the first trace is connected to the second trace by the conducting layer.

16 Claims, 5 Drawing Sheets

(56) References Cited

U.S. PATENT DOCUMENTS

| | | | | |
|---|---|---|---|---|
| 2018/0188579 A1* | 7/2018 | Jeong | ................ | G02F 1/133345 |
| 2020/0259056 A1* | 8/2020 | Hong | ................. | H01L 27/1262 |
| 2021/0183897 A1* | 6/2021 | Qi | ....................... | H01L 27/1288 |
| 2021/0399185 A1* | 12/2021 | Liu | ........................ | H01L 33/62 |
| 2022/0020779 A1* | 1/2022 | Wei | ..................... | H10K 50/844 |
| 2022/0053646 A1* | 2/2022 | Cheng | ..................... | H05K 3/28 |
| 2023/0170355 A1* | 6/2023 | Byun | ................. | H01L 25/0753 |
| | | | | 257/72 |

FOREIGN PATENT DOCUMENTS

| | | | | | |
|---|---|---|---|---|---|
| CN | 110121676 | | 8/2019 | | |
| CN | 110211973 | | 9/2019 | | |
| CN | 110515485 | A * | 11/2019 | ............. | B41M 1/12 |
| CN | 111063255 | | 4/2020 | | |
| CN | 112086036 | | 12/2020 | | |
| CN | 112750370 | | 5/2021 | | |
| CN | 113039647 | A * | 6/2021 | ........... | G02F 1/1303 |
| CN | 10-2021-0095205 | | 7/2021 | | |
| CN | 109739057 | B * | 2/2023 | | |
| KR | 10-2021-0095205 | | 7/2021 | | |

\* cited by examiner

DISPLAY PANEL INCLUDING A SUBSTRATE HAVING PROTRUDING PORTIONS, METHOD FOR MANUFACTURING DISPLAY PANEL, AND DISPLAY DEVICE

RELATED APPLICATIONS

This application is a National Phase of PCT Patent Application No. PCT/CN2021/139295 having International filing date of Dec. 17, 2021, which of Chinese Patent Application claims the benefit of priority No. 202111505677.7 filed on Dec. 10, 2021. The contents of the above applications are all incorporated by reference as if fully set forth herein in their entirety.

FIELD AND BACKGROUND OF INVENTION

The present disclosure relates to the technical field of display devices, and in particular, to a display panel, a method for manufacturing a display panel, and a display device.

With the improvement of the display panel performance and the chip on film (COF) bonding process, the splicing screen technology has been widely used in panel manufacturing. Splicing screens have a wide range of applications in the market, and can be applied to commercial display, the outdoors, security monitoring, and the like. Most of the conventional splicing screens are spliced by a plurality of sub-display panels. However, two adjacent sub-display panels always have an area that cannot be displayed in a splicing area, that is, the so-called splicing gap, which is referred to as a seam for short. The width of the seam on the splicing screen affects the display effect.

Therefore, the technology of narrowing the seam has many advantages. For example, the ultra narrow border (UNB) and extremely narrow border (ENB) technologies can splice a panel having a larger area, so as to enhance the flexibility of the customer market application, thereby realizing the seamless splicing design without a border. Currently, in order to narrow the non-display area and the border of the panel as much as possible, a side printing technology is required to lead lines to the back side of the substrate, so that the lines are bound to the printed circuit board (PCB) of the driving circuit from the back side.

At present, the common side printing technology includes the following two major categories. One category is to directly manufacture a line-shaped groove on a mold, fill the line-shaped groove with silver paste, and then transfer the line-shaped groove to the substrate to form a silver wire. However, it is difficult to achieve high-precision line width and line spacing using this technology, and burrs are easily formed between the silver wires, resulting in a short circuit. The other category is to first form the continuous silver film on the substrate and then form the silver wire by performing engraving using laser. However, this technology has the problem of the short circuit caused by the splashing of the silver paste of the laser among the silver wires.

SUMMARY OF THE INVENTION

Technical Problem

Embodiments of the present disclosure provide a display panel, a method for manufacturing a display panel, and a display device, to resolve the problem of a short circuit easily caused by a side printing technology.

Technical Solution

The present disclosure provides a display panel, including:
- a substrate including a first surface and a second surface facing away from each other, wherein a plurality of first protruding portions are disposed on a first edge of the substrate;
- a line layer including a plurality of first traces and a plurality of second traces, wherein the first traces are disposed on the first surface, the second traces are disposed on the second surface, and each of the first traces and each of the second traces respectively extend to one of the first protruding portions; and
- a conducting layer covering the first protruding portion, wherein the first trace is connected to the second trace by the conducting layer.

In the display panel according to the present disclosure, the conducting layer further covers a side surface of the first protruding portion away from the substrate.

In the display panel according to the present disclosure, a width by which each of the first protruding portions protrudes from the first edge ranges from 30 microns to 60 microns.

In the display panel according to the present disclosure, an edge of the conducting layer is flush with the first edge or located inside the first protruding portion.

In the display panel according to the present disclosure, the substrate further includes a second edge. A plurality of second protruding portions are disposed on the second edge. The first edge is disposed opposite to the second edge.

Two ends of the each first trace respectively extend to one of the first protruding portions and one of the second protruding portions. Two ends of the each second trace respectively extend to the first protruding portion and the second protruding portion.

The conducting layer covers the second protruding portion.

In the display panel according to the present disclosure, a width by which each of the second protruding portions protrudes from the second edge ranges from 30 microns to 60 microns.

In the display panel according to the present disclosure, an edge of the conducting layer is flush with the second edge or located inside the second protruding portion.

The display panel according to the present disclosure further includes:
- a protective film wrapped around the first protruding portion along the first surface and the second surface and covering the conducting layer.

In the display panel according to the present disclosure, the protective film is further wrapped around a gap between two adjacent first protruding portions.

In the display panel according to the present disclosure, the protective film is a black light-shielding film.

In the display panel according to the present disclosure, the protective film further covers a side surface of the first protruding portion away from the substrate.

In the display panel according to the present disclosure, the protective film is wrapped around the second protruding portion along the first surface and the second surface, and covers the conducting layer of the second protruding portion.

In the display panel according to the present disclosure, the protective film is further wrapped around a gap between two adjacent second protruding portions.

The present disclosure further provides a method for manufacturing a display panel. The method includes following steps:

etching a first edge of a substrate to form a plurality of first protruding portions;

forming a plurality of first traces on a first surface of the substrate, and forming a plurality of second traces on a second surface of the substrate, wherein each of the first traces and each of the second traces respectively extend to one of the first protruding portions; and     printing conductive paste on the first protruding portion to form a conducting layer, so that the first trace is connected to the second trace.

In the method for manufacturing a display panel according to the present disclosure, the step of printing the conductive paste on the first protruding portion to form the conducting layer further includes:

printing the conductive paste on the first surface of the substrate;

printing the conductive paste on a third surface of the substrate, wherein the third surface is a side surface connecting the first surface to the second surface; and     turning the substrate and printing the conductive paste on the second surface of the substrate.

The method for manufacturing a display panel according to the present disclosure further includes:

etching a second edge of the substrate to form a plurality of second protruding portions;

forming the plurality of first traces on the first surface of the substrate, and forming the plurality of second traces on the second surface of the substrate, wherein the each first trace and the each second trace respectively extend to one of the second protruding portions; and     printing the conductive paste on the second protruding portion to form the conducting layer, so that the first trace is connected to the second trace.

In the method for manufacturing a display panel according to the present disclosure, after the step of printing the conductive paste on the first protruding portion to form the conducting layer, the method further includes:

attaching a protective film to the first protruding portion along the first edge, so that the protective film is wrapped around the conducting layer.

The present disclosure further provides a display device. The display device includes a spliced panel. The spliced panel includes a plurality of spliced display panels. Each of the display panels includes:

a substrate including a first surface and a second surface facing away from each other, wherein a plurality of first protruding portions are disposed on a first edge of the substrate;

a line layer including a plurality of first traces and a plurality of second traces, wherein the first traces are disposed on the first surface, the second traces are disposed on the second surface, and each of the first traces and each of the second traces respectively extend to one of the first protruding portions; and     a conducting layer covering the first protruding portion, wherein the first trace is connected to the second trace by the conducting layer.

In the display device according to the present disclosure, the conducting layer further covers a side surface of the first protruding portion away from the substrate.

In the display device according to the present disclosure, the substrate further includes a second edge. A plurality of second protruding portions are disposed on the second edge. The first edge is disposed opposite to the second edge.

Two ends of the each first trace respectively extend to one of the first protruding portions and one of the second protruding portions. Two ends of the each second trace respectively extend to the first protruding portion and the second protruding portion.

The conducting layer covers the second protruding portion.

In the display device according to the present disclosure, the display panel further includes:

a protective film wrapped around the first protruding portion along the first surface and the second surface and covering the conducting layer.

Beneficial Effects

The present disclosure has the following beneficial effects. The plurality of first protruding portions are disposed on the first edge of the substrate, so that the first traces located on the first surface of the substrate and the second traces located on the second surface of the substrate respectively extend to the first protruding portion. The conducting layer covers the first protruding portion to connect the first trace to the second trace. Through the arrangement of the first protruding portion, each of the first traces can be separated from each of the second traces, thereby avoiding a short circuit between adjacent first traces or a short circuit between adjacent second traces while realizing high-precision line width and line spacing of the traces. Therefore, the yield of the wire printing process can be effectively increased, and a simple process is achieved.

DESCRIPTION OF SPECIFIC EMBODIMENTS OF THE INVENTION

The technical solutions in the embodiments of this application are clearly and completely described in the following with reference to the accompanying drawings in the embodiments of the present disclosure. Apparently, the described embodiments are merely some rather than all of the embodiments of the present disclosure. All other embodiments obtained by a person skilled in the art based on the embodiments of the present disclosure without creative efforts shall fall within the protection scope of the present disclosure.

In the description of the present disclosure, it should be understood that features defined by terms such as "first" or "second" may explicitly or implicitly include one or more such features. In the descriptions of the present disclosure, "a plurality of" means two or more, unless otherwise definitely and specifically limited. It should be noted that unless otherwise explicitly specified or defined, the terms such as "connect" and "connection" should be understood in a broad sense. For example, the connection may be a direct connection or an indirect connection through an intermediary; or may be an internal communication between two components, or may be an interactive relationship between two components. A person of ordinary skill in the art may understand the specific meanings of the foregoing terms in the present disclosure according to specific situations.

A display panel, a method for manufacturing a display panel, and a display device provided in the embodiments of the present disclosure are described in detail below respectively.

Figure 1:
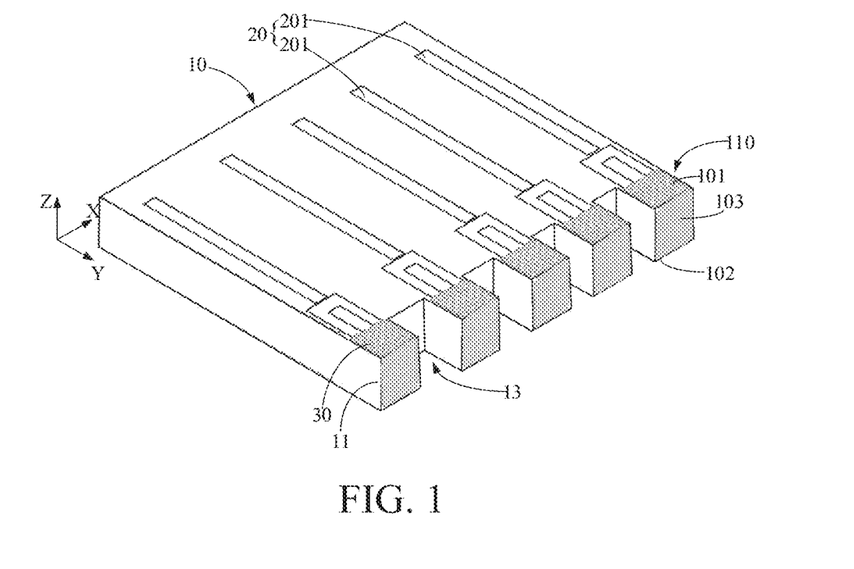
FIG. 1 is a schematic diagram of a structure of a display panel according to an embodiment of the present disclosure.
Figure 2:
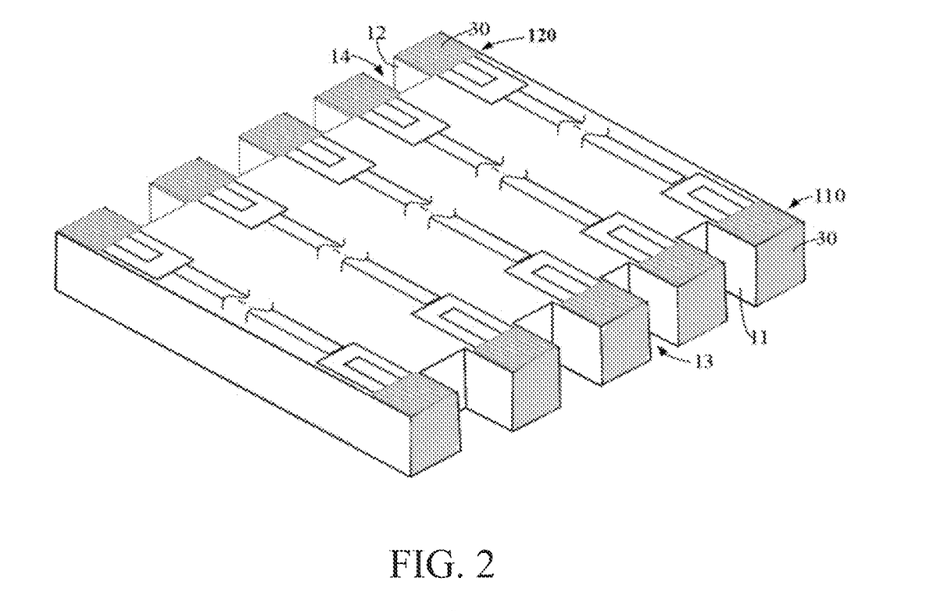
FIG. 2 is a schematic diagram of a structure of a display panel according to another embodiment of the present disclosure.
Figure 3:
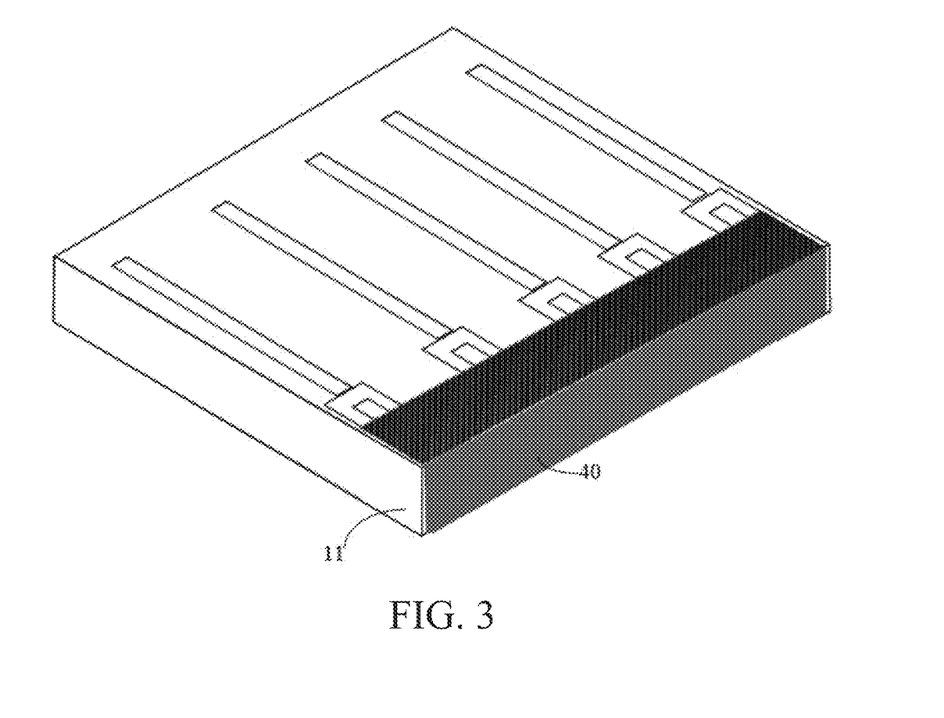
FIG. 3 is a schematic diagram of a structure of a protective film of a display panel according to an embodiment of the present disclosure.

Referring to FIGS. 1 to 3, the embodiments of the present disclosure provide a display panel, including a substrate 10, a line layer 20, and a conducting layer 30.

The substrate 10 may be a rigid substrate or a flexible substrate. For example, the substrate 10 may be a glass substrate or a polyimide (PI) substrate.

The substrate 10 includes a first surface 101 and a second surface 102 facing away from each other. A first edge 110 of the substrate 10 may be an edge extending in a first direction X. A plurality of first protruding portions 11 are disposed on the first edge 110, and two adjacent first protruding portions 11 are spaced apart from each other. For example, the first surface 101 may be a front side of the substrate 10, and the second surface 102 may be a back side of the substrate 10. The first protruding portion 11 may be formed by cutting or etching the substrate 10. That is to say, the first protruding portion 11 and the substrate 10 are integrally formed, so that a manufacturing process can be simplified while guaranteeing the structural strength. In detail, an etching process may be, for example, laser cutting, wet etching, or the like. This is not limited in detail herein.

The line layer 20 includes a plurality of first traces 201 and a plurality of second traces 202 that extend in a second direction Y. The first traces 201 are disposed on the first surface 101. The second traces 202 are disposed on the second surface 102. Each of the first traces 201 and each of the second traces 202 respectively extend to one of the first protruding portions 11. Correspondingly, the first traces 201 are traces disposed on the front side of the substrate 10, and the second traces 202 are traces disposed on the back side of the substrate 10.

The first trace 201 or the second trace 202 can extend to an edge of the first protruding portion 11 or any position inside the first protruding portion 11 when extending to the first protruding portion 11, which is not limited in detail herein in the present embodiment.

In addition, the first trace 201 and the second trace 202 may extend in a same direction on the first surface 101 and the second surface 102 respectively. The first trace 201 may extend in a straight line, in a curve, or in both the straight line and the curve. Similarly, the second trace 202 may extend in a straight line, in a curve, or in both the straight line and the curve.

For example, the first edge 110 extends in the first direction X. The plurality of first traces 201 and the plurality of second traces 202 extend in the second direction Y. The second direction Y intersects with the first direction X. The second direction Y and the first direction X may be perpendicular to each other. By taking a rectangular plane coordinate system as an example, the first direction may be an X-axis direction, and the second direction is a Y-axis direction. It is to be noted that, "perpendicular" refers to a state that an angle formed by two straight lines is above 800 and below 100°. Therefore, a state of an angle of above 850 and below 950 is also included.

The conducting layer 30 is disposed on the first protruding portion 11 and covers the first protruding portion 11. The conducting layer 30 may be printed on the first protruding portion 11 by printing, so that the first trace 201 is connected to the second trace 202 by the conducting layer 30. The conducting layer 30 is made of conductive paste. The conductive paste may be a metal material such as silver paste, solder paste and the like having a conductive function, which is not limited in detail herein.

According to the display panel provided in the present disclosure, the plurality of first protruding portions 11 spaced apart from each other are disposed on the first edge 110 of the substrate 10, so that the first trace 201 located on the first surface 101 of the substrate 10 and the second trace 202 located on the second surface 102 of the substrate 10 respectively extend to the first protruding portion 11. The conducting layer 30 covers the first protruding portion 11 to connect the first trace 201 to the second trace 202. Through the arrangement of the first protruding portion 11, each of the first traces 201 can be separated from each of the second traces 202, thereby avoiding a short circuit between adjacent first traces 201 or a short circuit between adjacent second traces 202 while realizing high-precision line width and line spacing of the traces. Therefore, the yield of the wire printing process can be effectively increased, and a simple process is achieved.

In some embodiments, the substrate 10 further includes a third surface 103. The third surface 103 is formed on an end surface of the first protruding portion 11 away from the first edge 110. The third surface 103 is disposed adjacent to the first surface 101 and the second surface 102. In detail, by taking the first surface 101 as the front side and the second surface 102 as the back side, the third surface 103 is a side surface connecting the front side to the back side. In detail, in the present embodiment, the third surface 103 is the side surface further covered by the conducting layer 30 on the first protruding portion 11, that is to say, the conducting layer 30 further covers the third surface 103. For example, the third surface 103 is a plane formed by the first direction X and a third direction Z. The conducting layer 30 is simultaneously printed on the first surface 101, the second surface 102, and the third surface 103. The conducting layer 30 is printed on three surfaces adjacent to the first protruding portion 11, the conductive paste is in a "C-shaped" structure, so that the first trace 201 can be connected to the second trace 202. In addition, the first trace 201 can be prevented from being connected to adjacent traces, or the second trace 202 can be prevented from being connected to adjacent traces, thereby preventing the short circuits of the traces.

In some embodiments, as shown in FIG. 2, the substrate 10 further includes a second edge 120. The first edge 110 is disposed opposite to the second edge 120. In detail, the first edge 110 and the second edge 120 are spaced apart from each other in a same direction on the substrate 10. For example, the first edge 110 and the second edge 120 are both disposed in the first direction X, and are spaced apart from each other on the substrate 10.

A plurality of second protruding portions 12 are disposed on the second edge 120, and two adjacent second protruding portions 12 are spaced apart from each other. Two ends of each of the first traces 201 respectively extend to one of the first protruding portions 11 and one of the second protruding portions 12. Two ends of each of the second traces 202 respectively extend to the first protruding portion 11 and the second protruding portion 12. The conducting layer 30 covers the second protruding portion 12. The plurality of first protruding portions 11 and the plurality of second protruding portions 12 may be symmetrically disposed. That is to say, the first protruding portion and the second protruding portion are respectively disposed on two sides of the substrate 10 in a one-to-one correspondence, or may be in a staggered arrangement, which is not limited in detail herein. The protruding portion is disposed on the edges on the two sides of the substrate 10 for trace printing, so as to increase the density of the printed traces, thereby improving the display performance.

In some embodiments, a width by which each of the first protruding portions 11 and/or each of the second protruding portions 12 protrude(s) from the edge of the substrate 10 ranges from 30 microns to 60 microns. In the present embodiment, the width refers to a distance by which the first protruding portion 11 or the second protruding portion 12 protrudes from the edge of the substrate 10 in the second direction Y. By taking the first protruding portion 11 as an example, the width by which the first protruding portion 11 protrudes from the edge of the substrate 10 may be 30 µm, 50 µm, 60 µm, or the like. When a width of the each first trace 201 formed by printing is specified, by setting the width of the first protruding portion 11 to be greater than 30 µm, an area of the conducting layer 30 such as the silver paste in contact with the first trace 201 can be increased, preventing the short circuit or bad contact of the traces. In addition, the width of the first protruding portion 11 is set to be less than 60 µm, so that when a plurality of display panels are spliced, the area between spliced parts cannot be excessively large, and seam widths of the spliced panel can be decreased, thereby ensuring the aesthetic degree of the display effect.

In some embodiments, the display panel further includes a protective film 40. As shown in FIG. 3, the protective film 40 is wrapped around the first protruding portion 11 along the first surface 101 to the second surface 102. The protective film 40 covers the conducting layer 30. The protective film 40 may be an insulating film made of an organic adhesive material, and is configured to protect the conducting layer 30 printed on the first protruding portion 11 from being damaged in the following process. In detail, the protective film 40 may be a black protective film 40, so that light leakage can be prevented while the conducting layer 30 is protected. It is to be noted that, the protective film 40 may be attached to a side edge of the substrate 10 having the first protruding portion 11 disposed thereon, or may be attached to edges of a plurality of sides of the substrate 10. For example, the protective film is attached to peripheral edges of the substrate 10.

It is to be noted that, the protective film 40 may completely wrap around the conducting layer 30. The protective film 40 may partially cover the edge of the first protruding portion 11, may completely cover the first protruding portion 11, or may partially cover the substrate 10 while partially covering the first protruding portion 11. In the present embodiment, a coverage width of the protective film 40 on the first protruding portion 11 is not limited in detail.

It can be understood that, a plurality of protective films 40 may be disposed. Correspondingly, the protective film 40 may also be disposed on the second protruding portion 12. The protective film 40 is wrapped around the second protruding portion 12 along the first surface 101 to the second surface 102, so that the protective film 40 covers the conducting layer 30 of the second protruding portion 12, and can also have protection and light shielding effects on the trace on the second protruding portion 12.

In some embodiments, referring to FIGS. 2 and 3, the protective film 40 is further wrapped around a gap between two adjacent first protruding portions 11. In detail, a first recess 13 is formed in the gap between the two adjacent first protruding portions 11. The first edge 110 further includes a plurality of first recesses 13, and each of the first recesses 13 is disposed adjacent to each of the first protruding portions 11. The protective film 40 is further wrapped around the first recess 13 and the first protruding portion 11. The protective film 40 is wrapped around the first recess 13 and the first protruding portion 11 simultaneously. That is to say, the protective film 40 covers the gap between the two adjacent first protruding portions 11, so that the whole surface wrapping of the protective film 40 can be realized. Compared with the manner of separately wrapping the each first protruding portion 11, the whole surface wrapping can guarantee a desirable protection effect while simplifying the process.

It may be understood that, the protective film 40 may further wrap around a gap between two adjacent second protruding portions 12. A plurality of second recesses 14 are further disposed on the second edge 120. The second recess 14 and the second protruding portion 12 that are adjacent to each other are spaced apart from each other. The whole surface of the protective film 40 is wrapped around the plurality of second protruding portions 12, so as to prevent the short circuit between the first trace 201 or the second trace 202.

In some embodiments, the edge of the conducting layer 30 is flush with the first edge 110 or located inside the first protruding portion 11. For example, when the conducting layer 30 is in a plane in which the first surface 101 or the second surface 102 is located, the width of the conducting layer 30 does not exceed the width of the first protruding portion 11. The width of the conducting layer 30 is a distance by which the trace extends in the second direction Y. In detail, the width of the conducting layer 30 may be same as the width of the first protruding portion 11. In this case, the edge of the conducting layer 30 is flush with the first edge 110. The width of the conducting layer 30 may also be less than the width of the first protruding portion 11. In this case, the edge of the conducting layer 30 is located inside the first protruding portion 11. The width of the conducting layer 30 is controlled to not exceed the width of the first protruding portion 11, so that the conducting layer 30 is not located in the substrate 10, thereby preventing the conducting layer 30 from coming into contact with the first trace 201 or the second trace 202 in the substrate 10, causing the short circuit between the adjacent first traces 201 or the adjacent second traces 202 in the substrate 10. In this way, the manufacturing yield can be increased.

It may be understood that, the edge of the conducting layer 30 may also be flush with the second edge 120 or located inside the second protruding portion 12. Likewise, the problem, caused by the conducting layer 30, of the short circuit between the adjacent first traces 201 or the adjacent second traces 202 in the substrate 10 may also be avoided, thereby increasing the manufacturing yield.

Figure 4:
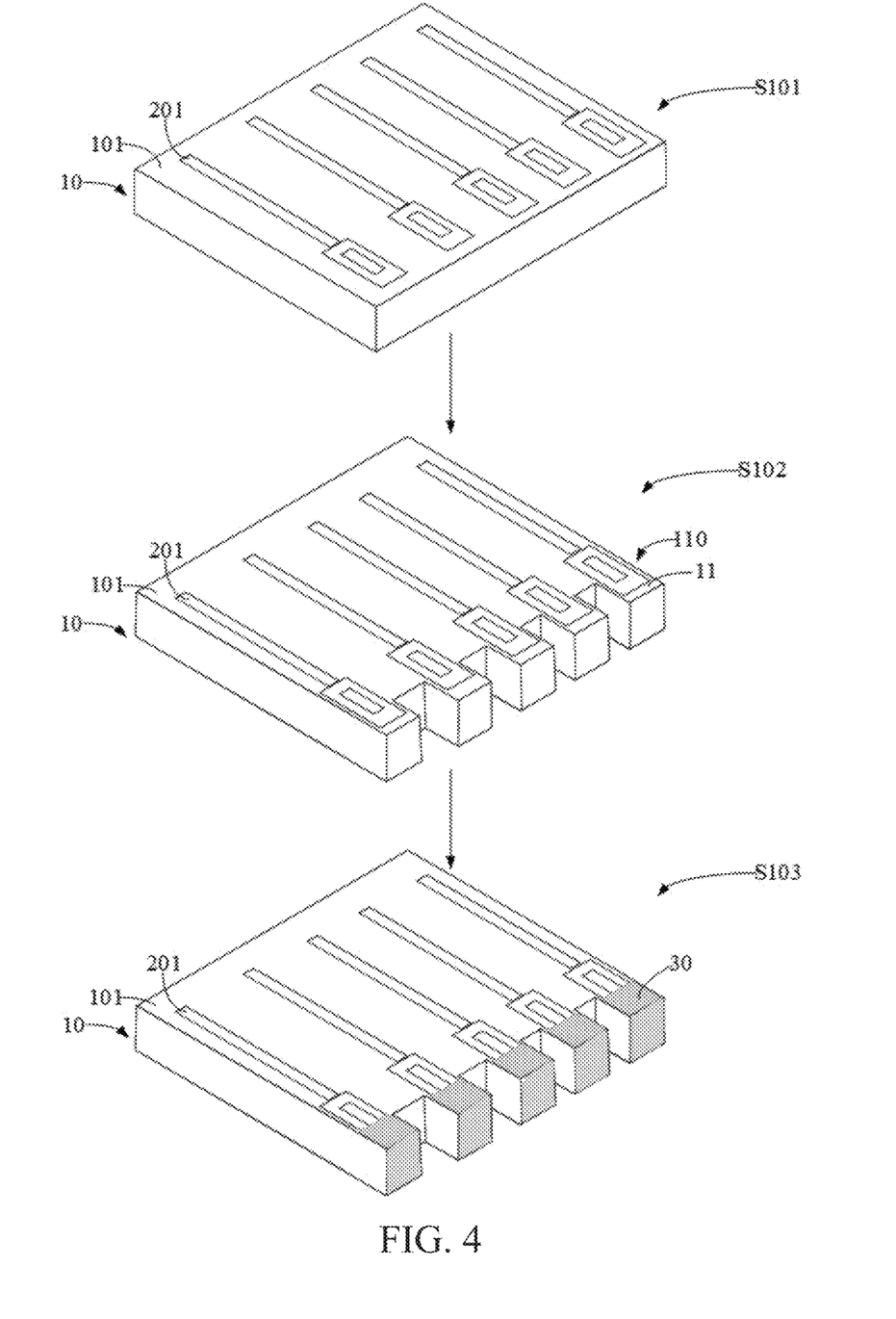
FIG. 4 is a schematic flowchart of a method for manufacturing a display panel according to an embodiment of the present disclosure.

In order to better implement the display panel in the present disclosure, an embodiment of the present disclosure further provides a method for manufacturing a display panel. As shown in FIG. 4, the method includes steps S101-S103.

S101: Etching a first edge 110 of a substrate 10 to form a plurality of first protruding portions 11.

The first protruding portion 11 may be formed by cutting or etching the substrate 10. That is to say, the first protruding portion 11 and the substrate 10 are integrally formed, so that a manufacturing process can be simplified while guaranteeing the structural strength. In detail, an etching process may be, for example, laser cutting, wet etching, or the like. This is not limited in detail herein.

S102: Forming a plurality of first traces 201 on a first surface 101 of the substrate 10, and forming a plurality of second traces 202 on a second surface 102 of the substrate 10, wherein each of the first traces 201 and each of the second traces 202 respectively extend to one of the first protruding portions 11.

The first trace 201 or the second trace 202 can extend to an edge of the first protruding portion 11 or any position inside the edge of the first protruding portion 11 when extending to the first protruding portion 11, which is not limited in detail herein in the present embodiment.

S103: Printing conductive paste on the first protruding portion 11 to form a conducting layer 30, so that the first trace 201 is connected to the second trace 202.

The conductive paste may be metal paste for achieving electric conduction, such as silver paste, solder paste, and the like.

According to the display panel provided in the present disclosure, the plurality of first protruding portions 11 spaced apart from each other are etched on the first edge 110 of the substrate 10, so that the first trace 201 located on the first surface 101 of the substrate 10 and the second trace 202 located on the second surface 102 of the substrate 10 respectively extend to the first protruding portion 11. The conducting layer 30 covers the first protruding portion 11 to connect the first trace 201 to the second trace 202. Through the arrangement of the first protruding portion 11, each of the first traces 201 can be separated from each of the second traces 202, thereby avoiding a short circuit between adjacent first traces 201 or a short circuit between adjacent second traces 202 while realizing high-precision line width and line spacing of the traces. Therefore, the yield of the wire printing process can be effectively increased, and a simple process is achieved.

The step of manufacturing the first protruding portion 11 on the first edge of the substrate 10 is provided above. Correspondingly, the second protruding portion 12 may also be manufactured on the second edge of the substrate 10. During the manufacturing of the second protruding portion 12, the embodiments of the present disclosure may further include steps S111-S113 below.

S111: Etching the second edge 120 of the substrate 10 to form a plurality of second protruding portions 12.

S112: Forming a plurality of first traces 201 on the first surface 101 of the substrate 10, and forming a plurality of second traces 202 on the second surface 102 of the substrate 10, wherein each of the first traces 201 and each of the second traces 202 respectively extend to one of the second protruding portions 12.

S113: Printing conductive paste on the second protruding portion 12 to form a conducting layer 30, so that the first trace 201 is connected to the second trace 202.

The first edge 110 is disposed opposite to the second edge 120. The protruding portion is disposed on the edges on the two sides of the substrate 10 for trace printing, so as to increase the density of the printed traces, thereby improving the display performance.

Figure 5:
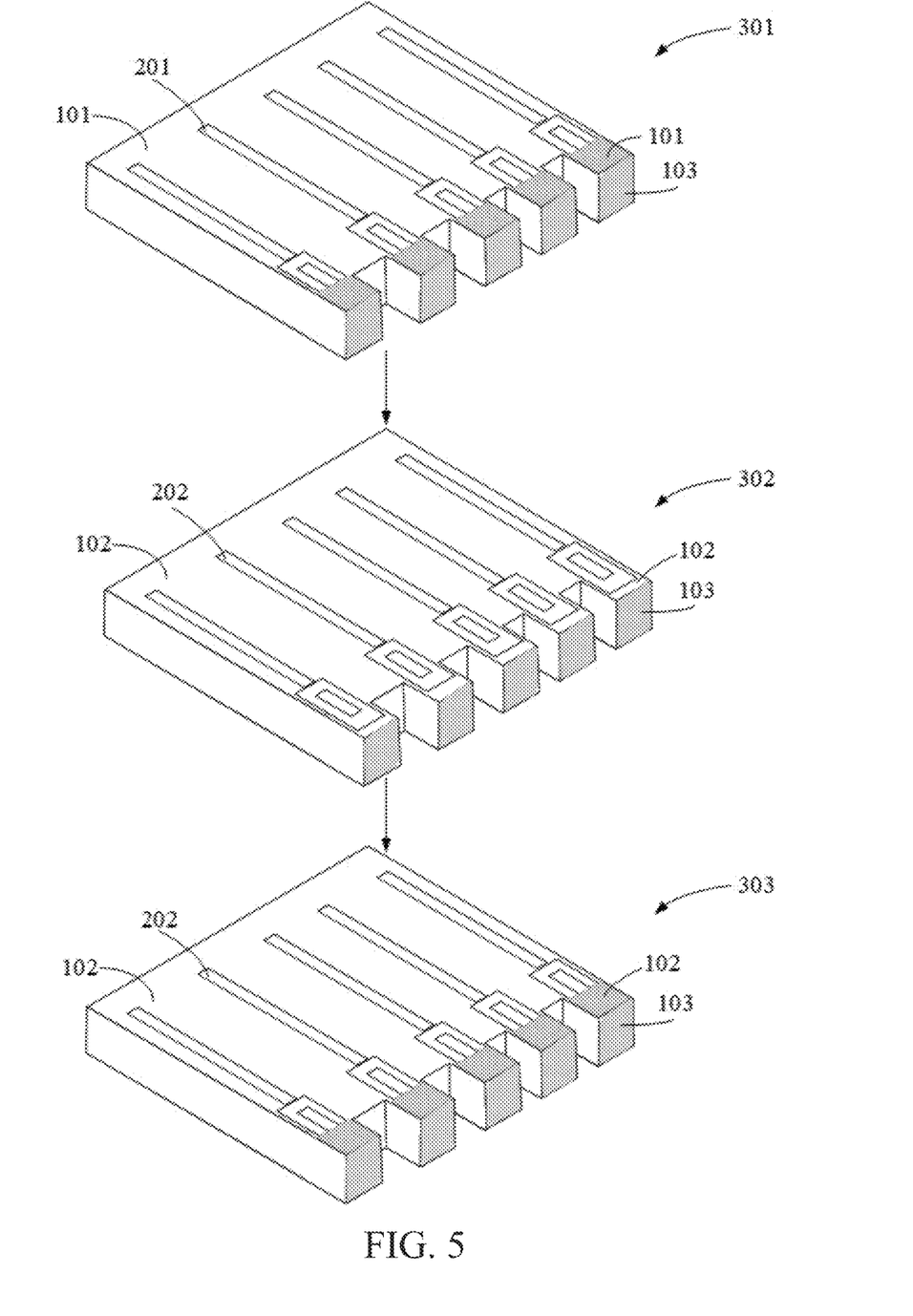
FIG. 5 is a schematic flowchart of a method for manufacturing a display panel according to another embodiment of the present disclosure.

In some embodiments, as shown in FIG. 5, step S103 of printing the conductive paste on the first protruding portion 11 to form the conducting layer 30 further includes steps S301-S303 below.

S301: Printing the conductive paste on the first surface 101 of the substrate 10. The first surface 101 may be a front side of the substrate 10.

S302: Printing the conductive paste on the third surface 103 of the substrate 10. The third surface 103 is a side surface connecting the first surface 101 to the second surface 102.

S303: Printing the conductive paste on the second surface 102 of the substrate 10. The second surface 102 may be a back side of the substrate 10. The conductive paste is printed on three surfaces adjacent to the first protruding portion 11. The conducting layer 30 is formed on each of the three surfaces adjacent to the first protruding portion 11, so that the conducting layer 30 is in a "C-shaped" structure, so as to ensure that the first trace 201 is connected to the second trace 202. In addition, the first trace 201 is not connected to a trace adjacent to the first trace, or the second trace 202 is not connected to a trace adjacent to the second trace, thereby preventing the short circuit of the traces.

During the printing of the conducting layer 30, the first surface 101 and the second surface 102 may be printed according to a sequential order, and then the third surface 103 is printed. Alternatively, the first surface 101 and the third surface 103 are printed simultaneously, and then the second surface 102 is printed. In this way, the three surfaces of each of the first protruding portions 11 are printed using two printing processes, thereby facilitating the simplification of the printing process.

It may be understood that, when the conducting layer 30 is printed on the second protruding portion 12, a same process may further be adopted, and details will not be described herein again in the present embodiment.

In some embodiments, after step S103 of printing the conductive paste on the first protruding portion 11 to form the conducting layer 30, so that the first trace 201 is connected to the second trace 202, the method may further include step S304 below.

S304: Attaching a protective film 40 to the first protruding portion 11 along the first edge 110, so that the protective film 40 is wrapped around the conducting layer 30.

The protective film 40 may be made of an organic adhesive material. The protective film 40 may be attached to the first surface 101, the second surface 102, and the third surface 103. The conducting layer 30 can be prevented from being damaged in the following process by attaching the protective film 40. The whole surface of the protective film 40 may be attached to the plurality of first protruding portions 11, or may be separately attached to the each first protruding portion 11. The protective film 40 may be made of a black adhesive material, so that the protective film 40 can have the effect of shielding light. It is to be noted that, the protective film 40 may be attached to a side edge of the substrate 10 having the first protruding portion 11 disposed thereon, or may be attached to edges of a plurality of sides of the substrate 10. For example, the protective film is attached to peripheral edges of the substrate 10.

It may be understood that, in the manufacturing method of the present embodiment, the protective film 40 may also be attached to the second protruding portion 12, and details will not be described herein again in the present embodiment.

In order to better implement the display panel in the present disclosure, an embodiment of the present disclosure further provides a display device including a spliced panel.

Figure 6:
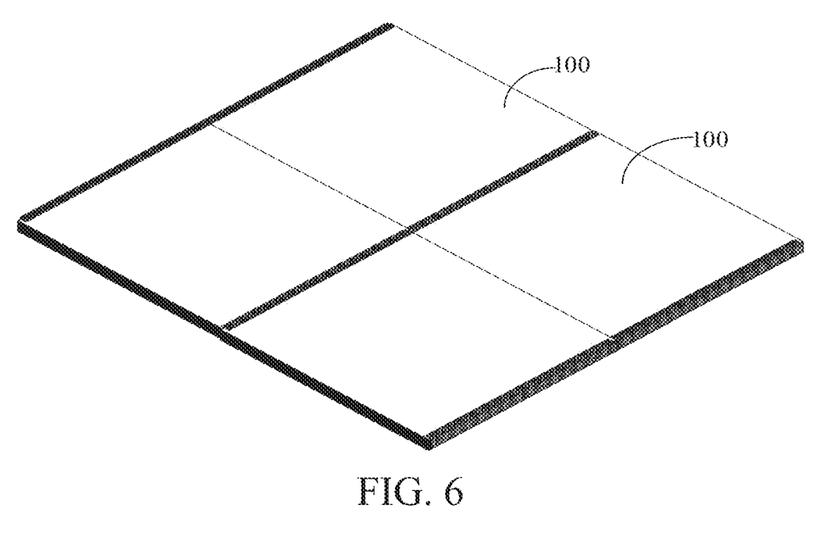
FIG. 6 is a schematic diagram of spliced display panels according to an embodiment of the present disclosure.

As shown in FIG. 6, the spliced panel includes a plurality of spliced display panels. Since the display device has the above display panels, the display device has all of same beneficial effects, and the details will not be described herein again in the present embodiment. The embodiments of the present disclosure do not limit the application of the display device in detail. the display device may be any product or component having a display function, such as a television, a notebook computer, a tablet computer, a mobile phone, a vehicle display, an advertising lamp box, or the like.

The above embodiments each are emphasized. For parts not described in detail in a certain embodiment, reference may be made to related descriptions of other embodiments. During the detailed implementation, each of the above units or structures may be implemented as independent entities, or may be combined randomly and implemented as a same entity or a plurality of entities. For the detailed implementation of each of the above units or structures, reference may be made to the foregoing method embodiments, and the details will not be described herein again.

A display panel, a method for manufacturing a display panel, and a display device provided in the embodiments of the present disclosure are described above in detail. Although the principles and implementations of the present disclosure are described by using specific examples in this specification, the descriptions of the above embodiments are merely intended to help understand the technical solutions and the core idea of the embodiments of the present disclosure. A person of ordinary skill in the art should understand that modifications may be made to the technical solutions described in the foregoing embodiments or equivalent replacements may be made to some technical features thereof, as long as such modifications or replacements do not make the essence of corresponding technical solutions depart from the scope of the technical solutions of the embodiments of the present disclosure.

What is claimed is:

1. A display panel, comprising:
   a substrate comprising a first surface and a second surface facing away from each other, the substrate further comprising a first edge and a second edge disposed opposite to each other, wherein a plurality of first protruding portions are disposed on the first edge, a plurality of second protruding portions are disposed on the second edge, the plurality of first protruding portions and the plurality of second protruding portions are symmetrically disposed or in a staggered arrangement, and the plurality of first protruding portions and the plurality of second protruding portions are integrally formed with the substrate;
   a line layer comprising a plurality of first traces and a plurality of second traces, wherein the plurality of first traces are disposed on the first surface, the plurality of second traces are disposed on the second surface, two ends of each of the first traces respectively extend to one of the first protruding portions and one of the second protruding portions, and two ends of each of the second traces respectively extend to the first protruding portion and the second protruding portion;
   a conducting layer covering the plurality of first protruding portions and the plurality of second protruding portions, wherein the first trace is connected to the second trace by the conducting layer; and
   a protective film, wherein a whole surface of the protective film is attached to the plurality of first protruding portions and the plurality of second protruding portions, and is further wrapped around a gap between two adjacent ones of the plurality of first protruding portions and a gap between two adjacent ones of the plurality of second protruding portions.

2. The display panel as claimed in claim 1, wherein the conducting layer further covers a side surface of each of the first protruding portions away from the substrate.

3. The display panel as claimed in claim 1, wherein a width by which each of the first protruding portions protrudes from the first edge ranges from 30 microns to 60 microns.

4. The display panel as claimed in claim 1, wherein an edge of the conducting layer is flush with the first edge or located inside each of the first protruding portions.

5. The display panel as claimed in claim 1, wherein a width by which each of the second protruding portions protrudes from the second edge ranges from 30 microns to 60 microns.

6. The display panel as claimed in claim 1, wherein an edge of the conducting layer is flush with the second edge or located inside each of the second protruding portions.

7. The display panel as claimed in claim 1, wherein the protective film is wrapped around the plurality of first protruding portions and the plurality of second protruding portions along the first surface and the second surface.

8. The display panel as claimed in claim 7, wherein the protective film is a black light-shielding film.

9. The display panel as claimed in claim 7, wherein the protective film is further wrapped around a side surface of each of the first protruding portions away from the substrate.

10. A method for manufacturing the display panel according to claim 1, comprising following steps:
    etching the first edge of the substrate to form the plurality of first protruding portions;
    forming the plurality of first traces on the first surface of the substrate, and forming the plurality of second traces on the second surface of the substrate, wherein each of the first traces and each of the second traces respectively extend to one of the first protruding portions; and
    printing conductive paste on each of the first protruding portions to form the conducting layer, so that each of the first traces is connected to each of the second traces.

11. The method for manufacturing the display panel as claimed in claim 10, wherein the step of printing the conductive paste on each of the first protruding portions to form the conducting layer further comprises following steps:
    printing the conductive paste on the first surface of the substrate;
    printing the conductive paste on a third surface of the substrate, wherein the third surface is a side surface connecting the first surface to the second surface; and
    turning the substrate and printing the conductive paste on the second surface of the substrate.

12. The method for manufacturing the display panel as claimed in claim 10, further comprising following steps:
    etching the second edge of the substrate to form the plurality of second protruding portions;
    forming the plurality of first traces on the first surface of the substrate, and forming the plurality of second traces on the second surface of the substrate, wherein each of the first traces and each of the second traces respectively extend to one of the second protruding portions; and
    printing the conductive paste on the plurality of second protruding portions to form the conducing layer, so that each of the first traces is connected to each of the second traces.

13. The method for manufacturing the display panel as claimed in claim 10, wherein after the step of printing the conductive paste on each of the first protruding portions to form the conducting layer, the method further comprises a following step:

attaching the protective film to the plurality of first protruding portions along the first edge, so that the protective film is wrapped around the conducting layer.

14. A display device, comprising a spliced panel, wherein the spliced panel comprises a plurality of spliced display panels, and each of the display panels comprises:

a substrate comprising a first surface and a second surface facing away from each other, the substrate further comprising a first edge and a second edge disposed opposite to each other, wherein a plurality of first protruding portions are disposed on the first edge, a plurality of second protruding portions are disposed on the second edge, the plurality of first protruding portions and the plurality of second protruding portions are symmetrically disposed or in a staggered arrangement, and the plurality of first protruding portions and the plurality of second protruding portions are integrally formed with the substrate;

a line layer comprising a plurality of first traces and a plurality of second traces, wherein the plurality of first traces are disposed on the first surface, the plurality of second traces are disposed on the second surface, two ends of each of the first traces respectively extend to one of the first protruding portions and one of the second protruding portions, two ends of each second trace each of the second traces respectively extend to one of the first protruding portions and one of the second protruding portions;

a conducting layer covering the plurality of first protruding portions and the plurality of second protruding portions, wherein each of the first traces is connected to each of the second traces by the conducting layer; and a protective film, wherein a whole surface of the protective film is attached to the plurality of first protruding portions and the plurality of second protruding portions, and is further wrapped around a gap between two adjacent ones of the plurality of first protruding portions and a gap between two adjacent ones of the plurality of second protruding portions.

15. The display device as claimed in claim 14, wherein the conducting layer further covers a side surface of the first protruding portion away from the substrate.

16. The display device as claimed in claim 14, wherein the protective film is wrapped around the plurality of first protruding portions and the plurality of second protruding portions along the first surface and the second surface.

* * * * *